US009075320B2

(12) United States Patent
Kominato et al.

(10) Patent No.: US 9,075,320 B2
(45) Date of Patent: Jul. 7, 2015

(54) MASK BLANK, TRANSFER MASK, METHOD OF MANUFACTURING A TRANSFER MASK, AND METHOD OF MANUFACTURING A SEMICONDUCTOR DEVICE

(71) Applicant: HOYA CORPORATION, Tokyo (JP)

(72) Inventors: Atsushi Kominato, Tokyo (JP); Masahiro Hashimoto, Tokyo (JP); Hiroyuki Iwashita, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 73 days.

(21) Appl. No.: 14/042,765

(22) Filed: Oct. 1, 2013

(65) Prior Publication Data

US 2014/0030641 A1    Jan. 30, 2014

Related U.S. Application Data

(62) Division of application No. 13/327,008, filed on Dec. 15, 2011, now Pat. No. 8,574,793.

(30) Foreign Application Priority Data

Dec. 17, 2010 (JP) ................................. 2010-281333

(51) Int. Cl.
G03F 1/50    (2012.01)
G03F 1/58    (2012.01)
(Continued)

(52) U.S. Cl.
CPC ............ G03F 1/50 (2013.01); Y10T 428/24942 (2015.01); G03F 1/58 (2013.01); G03F 1/00 (2013.01); G03F 1/74 (2013.01); G03F 7/2006 (2013.01)

(58) Field of Classification Search
CPC ........................................................ G03F 1/50

USPC ............... 430/5, 322, 323, 394; 428/428, 432
See application file for complete search history.

(56) References Cited

U.S. PATENT DOCUMENTS 6,753,538 B2    6/2004 Musil et al.
7,790,339 B2    9/2010 Yoshikawa et al.
(Continued)

FOREIGN PATENT DOCUMENTS

JP    2000-10260 A    1/2000
JP    2004-537758 A    12/2004
(Continued)

OTHER PUBLICATIONS

Office Action issued in corresponding Japanese Patent Application No. 2011-241318 dated Mar. 18, 2014.
(Continued)

Primary Examiner — Stephen Rosasco
(74) Attorney, Agent, or Firm — Sughrue Mion, PLLC

(57) ABSTRACT

A mask blank for use in the manufacture of a transfer mask adapted to be applied with ArF excimer laser exposure light is disclosed. The mask blank has, on a transparent substrate, a light-shielding film for forming a transfer pattern. The light-shielding film has an at least two-layer structure including a lower layer and an upper layer from the transparent substrate side. The lower layer is made of a material composed of a transition metal, silicon, and nitrogen and having a nitrogen content of 21 at % or more and a refractive index n of 1.9 or less. The upper layer is made of a material composed of a transition metal, silicon, and nitrogen and having a refractive index n of 2.1 or less. A surface layer of the upper layer contains oxygen and has a nitrogen content of 14 at % or more.

22 Claims, 3 Drawing Sheets

(51) Int. Cl.
*G03F 1/00* (2012.01)
*G03F 1/74* (2012.01)
*G03F 7/20* (2006.01)

(56) References Cited

U.S. PATENT DOCUMENTS

| | | |
|---|---|---|
| 7,862,963 B2 | 1/2011 | Shiota et al. |
| 2007/0212618 A1 | 9/2007 | Yoshikawa et al. |
| 2007/0212619 A1 | 9/2007 | Yoshikawa et al. |
| 2008/0063950 A1 | 3/2008 | Yoshikawa et al. |
| 2011/0212392 A1 | 9/2011 | Iwashita et al. |
| 2011/0229807 A1 | 9/2011 | Hashimoto et al. |
| 2012/0100466 A1 | 4/2012 | Hashimoto et al. |

FOREIGN PATENT DOCUMENTS

| | | |
|---|---|---|
| JP | 2007-241060 A | 9/2007 |
| JP | 2007-241065 A | 9/2007 |
| JP | 2007-292824 A | 11/2007 |
| TW | 200623233 A | 7/2006 |
| WO | 2007/138747 A1 | 12/2007 |
| WO | 2010/038445 A1 | 4/2010 |
| WO | 2010/050447 A1 | 5/2010 |
| WO | 2010/113475 A1 | 10/2010 |
| WO | 2010/113787 A1 | 10/2010 |

OTHER PUBLICATIONS

Azpiroz, Jaione Tirapu, et al., "Massively-Parallel FDTD Simulations to Address Mask Electromagnetic Effects in Hyper-NA Immersion Lithography", Optical Microlithography XXI, Proc. of SPIE, 2008, pp. 69240Y-1-69240Y-15, vol. 6924.

Communication dated Mar. 11, 2015, issued by the Taiwan Patent Office in corresponding application No. 100146569.

MASK BLANK, TRANSFER MASK, METHOD OF MANUFACTURING A TRANSFER MASK, AND METHOD OF MANUFACTURING A SEMICONDUCTOR DEVICE

This is a divisional of application Ser. No. 13/327,008 filed Dec. 15, 2011, claiming priority based on Japanese Patent Application No. 2010-281333 filed on Dec. 17, 2010, the contents of all of which are incorporated herein by reference in their entirety.

TECHNICAL FIELD

This invention relates to a mask blank, a transfer mask, a method of manufacturing a transfer mask, and a method of manufacturing a semiconductor device. In particular, this invention relates to a mask blank which enables a defect correction technique using charged particle irradiation to be suitably applied to a transfer mask manufactured from the mask blank and which can make small a bias for the transfer mask due to an electromagnetic field (EMF) effect, and further relates to such a transfer mask, a method of manufacturing such a transfer mask, and a method of manufacturing a semiconductor device using such a transfer mask.

BACKGROUND ART

Generally, fine pattern formation is carried out by the photolithography in the manufacture of a semiconductor device. A number of substrates called transfer masks (photomasks) are normally used for such fine pattern formation. The transfer mask comprises generally a transparent glass substrate having thereon a fine pattern made of a metal thin film or the like. The photolithography is used also in the manufacture of the transfer mask.

In the manufacture of a transfer mask by the photolithography, use is made of a mask blank having a thin film (e.g. a light-shielding film) for forming a transfer pattern (mask pattern) on a transparent substrate such as a glass substrate. The manufacture of the transfer mask using the mask blank comprises an exposure process of writing a required pattern on a resist film formed on the mask blank, a developing process of developing the resist film to form a resist pattern in accordance with the written pattern, an etching process of etching the thin film along the resist pattern, and a process of stripping and removing the remaining resist pattern. In the developing process, a developer is supplied after writing the required pattern on the resist film formed on the mask blank to dissolve a portion of the resist film soluble in the developer, thereby forming the resist pattern. In the etching process, using the resist pattern as a mask, an exposed portion of the thin film, where the resist pattern is not formed, is dissolved by dry etching or wet etching, thereby forming a required mask pattern on the transparent substrate. In this manner, the transfer mask is produced.

For miniaturization of a pattern of a semiconductor device, it is necessary to shorten the wavelength of exposure light for use in the photolithography in addition to the miniaturization of the mask pattern of the transfer mask. In recent years, the wavelength of exposure light for use in the manufacture of a semiconductor device has been shortened from KrF excimer laser light (wavelength: 248 nm) to ArF excimer laser light (wavelength: 193 nm).

As a type of transfer mask, apart from a conventional binary mask having a light-shielding film pattern made of a chromium-based material on a transparent substrate, there has recently appeared a binary mask using, as a light-shielding film, a material such as MoSiN containing a transition metal and silicon as main components and further containing nitrogen, as described in JP-A-2007-292824 (Patent Document 1).

In the meantime, hitherto, with respect to a transfer mask manufactured from a mask blank by forming a transfer pattern in a light-shielding film by dry etching using as a mask a resist pattern formed in a resist film by electron beam writing and development or an etching mask pattern formed in an etching mask film, defect correction has been carried out in the following manner. Specifically, a comparison is made, using a pattern inspection apparatus, between a design transfer pattern and the transfer pattern formed in the light-shielding film and a defect (so-called black defect) portion where the light-shielding film remains in excess as compared with the design transfer pattern is corrected by a physical treatment using nanomachining or focused ion beam (FIB) machining. However, there has been a problem that the correction of the black defect portion by such a physical treatment takes much time. Further, since the irradiation dose of Ga ions becomes large in the normal FIB machining, Ga stain remaining on a quartz substrate has been a problem. In view of this, there has been reported a technique of gas assist for enhancing the reactivity to suppress the Ga irradiation dose (see JP-A-2000-10260 (Patent Document 2)) or the like.

On the other hand, JP-A-2004-537758 (Patent Document 3) discloses a defect correction technique that supplies a xenon difluoride ($XeF_2$) gas to a black defect portion of a light-shielding film and irradiates an electron beam (EB) onto the black defect portion, thereby etching the black defect portion to remove it (hereinafter, such defect correction that is carried out by irradiating charged particles such as an electron beam while supplying a fluorine-containing substance such as a xenon difluoride gas will be referred to simply as "EB defect correction"). Such EB defect correction was at first used for correction of a black defect portion in an absorber film of a reflective mask for EUV lithography, but has started to be used also for defect correction of a MoSi-based halftone mask.

SUMMARY OF THE INVENTION

Using a binary mask blank formed with a light-shielding film of a laminated structure comprising an upper layer and a lower layer each made of a material containing a transition metal and silicon as main components and further containing nitrogen as disclosed in Patent Document 1, the present inventors produced a transfer mask formed with a transfer pattern in the light-shielding film, performed a defect inspection of the produced transfer mask, and performed EB defect correction of a black defect portion as disclosed in Patent Document 3, that is, performed etching of the black defect portion by supplying a $XeF_2$ gas to the black defect portion and irradiating charged particles such as an electron beam onto the black defect portion. As a result, it has been found that the following problems may occur depending on the relationship between the film compositions in the upper and lower layers of the laminated structure.

Generally, in order to suppress the surface reflection of a light-shielding film, the surface reflectance of the light-shielding film is reduced by setting the degree of oxidation or nitridation of a material of a layer on the surface side (upper layer) to be higher than that of a material of a layer on the substrate side (lower layer). On the other hand, in a binary mask blank, a light-shielding film is required to have a predetermined or higher light-shielding performance (e.g. an optical density (OD) of 2.8 or more), while, as the degree of oxidation or nitridation of a material of the light-shielding film increases, the light-shielding performance of the light-shielding film decreases. In the meantime, due to the miniaturization of a transfer pattern in recent years, it has become necessary to use an oblique illumination method or an immersion exposure method. Further, following the miniaturization of the transfer pattern, the miniaturization and complication of an auxiliary pattern are remarkable. In order to cope with them, a reduction in the thickness of the light-shielding film has become necessary. Therefore, it is necessary to minimize the degree of oxidation or nitridation in the layer on the substrate side (lower layer) in order to ensure the light-shielding performance with as small a thickness as possible. On the other hand, the surface reflectance on the substrate side (back-surface reflectance) of the light-shielding film should also be suppressed to a predetermined value or less although not so low as the surface reflectance on the surface side (front-surface reflectance) of the light-shielding film, and thus, the lower layer of the light-shielding film should also be oxidized or nitrided to some extent.

The $XeF_2$ gas is known as an isotropic etching gas for silicon. Etching proceeds in processes of surface adsorption, separation into Xe and F, and production and volatilization of a high-order fluoride of silicon. However, in the case of nitrided, oxidized, or carbonized silicon such as $Si_3N_4$, $SiO_2$, SiON, or SiC, a highly volatile high-order fluoride is not easily formed so that there is a tendency of having high etching resistance to a fluorine-based gas such as a $XeF_2$ gas. In EB defect correction, the $XeF_2$ gas etching rate is significantly improved by carrying out irradiation of charged particles such as an electron beam so that selective anisotropic etching of a black defect portion is enabled. However, even in this case, as the ratio of nitrided, oxidized, or carbonized silicon in the light-shielding film increases, the etching rate tends to be lowered. Since, as described above, the upper layer of the light-shielding film is made of the material with high degree of oxidation or nitridation in order to reduce the front-surface reflectance, the etching rate difference between the upper and lower layers becomes large so that a level difference occurs. In an extreme case, a large undercut is formed.

As described above, since the upper layer of the light-shielding film is made of the material with high degree of oxidation or nitridation, the etching rate of the upper layer is lower than that of the lower layer. Therefore, it takes much time to etch the upper layer for correction of a black defect portion by EB irradiation and, thus, while etching the upper layer, the lower layer of a pattern portion adjacent to the black defect portion to be corrected (e.g. the lower layer of a pattern portion adjacent to the black defect portion of the same pattern or the lower layer of a pattern adjacent to a pattern having the black defect portion) is etched (because even the portion other than the portion irradiated with EB is also placed in a state of being somewhat easily etched). As a result, the pattern side wall of the etched lower layer is retreated, while, since the EB defect correction etching rate of the upper layer above the retreated portion is significantly low, its pattern side wall remains as it was when it was patterned. As a consequence, a large undercut is formed also at the portion other than the black defect portion to be corrected, i.e. at the normal pattern portion.

According to the recent EB defect correction technique, using a passivation technique (supplying water, oxide-based gas, or the like) such as water passivation that lowers the etching rate by supplying water, it is possible to reduce the disadvantage even if there is some etching rate difference between the upper and lower layers of the light-shielding film. However, there is a limit to such etching rate control. Further, if the etching rate is excessively lowered, the correction time is prolonged so that the etching selectivity is reduced between the lower layer and a transparent substrate made of synthetic quartz or the like. As a consequence, there arise problems that a surface of the substrate is roughened, that etched recesses are locally formed on the substrate surface, and so on. Therefore, the laminated structure of the light-shielding film that requires the etching rate of the lower layer to be extremely lowered is not preferable.

In the meantime, in binary masks in the DRAM half-pitch (hp) 32 nm and subsequent generations according to the semiconductor device design rule, the line width of a transfer pattern of a transfer mask is smaller than the wavelength 193 nm of ArF exposure light and, as a result of using the resolution enhancement technology for coping with it, there has arisen a problem that if the thickness of a light-shielding film pattern in a transfer pattern area (main pattern area) is large, a bias due to an electromagnetic field (EMF) effect becomes large. Herein, "a bias due to an electromagnetic field (EMF) effect" represents a correction amount for correcting the discrepancy of the transfer pattern shape which occurs due to the EMF effect. Specifically, it represents a correction amount for correcting the discrepancy due to the EMF effect between a design transfer pattern formed in a transfer mask and an actual transfer pattern transferred to a resist on a wafer using this transfer mask. The bias due to the EMF effect largely affects the CD accuracy of the line width of the transfer pattern onto the resist on the wafer. Accordingly, it is necessary to carry out simulation, taking into account the EMF effect, to calculate in advance the bias to due to the EMF effect, thereby correcting the line width of the transfer pattern of the transfer mask and further adding an auxiliary pattern such as OPC (optical proximity correction) or SRAF (sub-resolution assist feature) to the transfer pattern of the transfer mask so that the actual transfer pattern transferred to the resist on the wafer coincides with the design transfer pattern. Calculation of this transfer pattern correction becomes more complicated as the bias due to the EMF effect increases. Further, a transfer pattern after the correction also becomes more complicated as the bias due to the EMF effect increases. As a consequence, a large load is applied to the manufacture of the transfer mask. These new problems have arisen due to the increase in bias due to the EMF effect.

Optical simulation in mask design of a binary mask is largely aimed at calculating a shape of a correction pattern such as OPC or SRAF to be additionally disposed, a correction amount (bias amount) of the pattern line width, and so on so that a designed transfer pattern is exposed and transferred to a transfer object (resist on a wafer, or the like) as designed. As this mask-design optical simulation, there is TMA (thin mask analysis) among others. TMA calculates a correction pattern shape and a pattern line width correction amount assuming that a light-shielding film of a transfer mask is an ideal film that has a predetermined optical density with its thickness being zero. Because of the simple simulation being carried out with the ideal film, there is a large merit that the calculation load of the simulation is small. However, since this is the simulation that does not take into account the EMF effect, the TMA simulation results alone are insufficient for a recent fine pattern which is largely affected by the EMF effect.

This invention has been made in order to solve the conventional problems and has an object to provide a mask blank which enables a defect correction technique using charged particle irradiation to be suitably applied to a transfer mask manufactured from the mask blank and which can make small a bias for the transfer mask due to an electromagnetic field (EMF) effect, and further to provide such a transfer mask, a method of manufacturing such a transfer mask, and a method of manufacturing a semiconductor device using such a transfer mask.

The present inventors have made an intensive study on the problems which arise when the EB defect correction technique is applied to the correction of the black defect portion of the transfer pattern of the light-shielding film in the transfer mask manufactured from the conventional binary mask blank having the light-shielding film of the laminated structure comprising the upper and lower layers each made of the material containing the transition metal and silicon as the main components and further containing nitrogen.

Further, the present inventors have made an intensive study on the bias due to the EMF effect.

First, the present inventors have paid attention to the fact that, in the case of a light-shielding film with a small influence of the EMF effect, it is easy to take advantage of the TMA simulation and thus to reduce the load of correction calculation for making an actual transfer pattern and a design transfer pattern coincide with each other. As a result of further studying a light-shielding film with a small influence of the EMF effect, it has been found that, by adjusting in predetermined ranges the contents of nitrogen in materials of a light-shielding film of a binary mask, it is possible not only to make small a bias due to the EMF effect, but also to solve the problems relating to the undercut which arise when the EB defect correction technique is applied to the conventional light-shielding film.

As a result of studying various materials, the present inventors have found that, in a mask blank comprising a light-shielding film having an at least two-layer structure comprising a lower layer composed of a material containing a transition metal, silicon, and nitrogen and an upper layer composed of a material containing a transition metal, silicon, and nitrogen, it is possible to solve the problems which arise when the EB defect correction technique is applied to the conventional light-shielding film, and further to make small a bias due to the EMF effect by adjusting the nitrogen content of the material of the lower layer to 21 at % or more and the refractive index n of the lower layer to 1.9 or less, adjusting the refractive index n of the upper layer to 2.1 or less, and adjusting the nitrogen content of a surface layer, in which oxygen is inevitably contained, of the upper layer to 14 at % or more, and have completed this invention.

In order to solve the above-mentioned problems, this invention has the following structures.

(Structure 1)
A mask blank adapted to manufacture a transfer mask applied with ArF excimer laser exposure light, comprising:
a transparent substrate; and
a light-shielding film formed on the transparent substrate, the light-shielding film serving to form a transfer pattern;
wherein the light-shielding film has an at least two-layer structure comprising a lower layer and an upper layer from a side of the transparent substrate,
the lower layer is made of a material composed of a transition metal, silicon, and nitrogen and having a nitrogen content of 21 at % or more and a refractive index n of 1.9 or less,
the upper layer is made of a material composed of a transition metal, silicon, and nitrogen and having a refractive index n of 2.1 or less, and
a surface layer of the upper layer contains oxygen and has a nitrogen content of 14 at % or more.

(Structure 2)
The mask blank according to structure 1, wherein the lower layer is substantially free of oxygen.

(Structure 3)
The mask blank according to structure 1 or 2, wherein a refractive index n of a material of the upper layer is greater than a refractive index n of a material of the lower layer.

(Structure 4)
The mask blank according to any one of structures 1 to 3, wherein a material of the upper layer has an extinction coefficient k of 1.6 or less and a material of the lower layer has an extinction coefficient k of 2.2 or more.

(Structure 5)
The mask blank according to any one of structures 1 to 4, wherein a difference between a ratio obtained by dividing a content of the transition metal in the lower layer by a total content of the transition metal and the silicon in the lower layer and a ratio obtained by dividing a content of the transition metal in the upper layer by a total content of the transition metal and the silicon in the upper layer is 4% or less.

(Structure 6)
The mask blank according to any one of structures 1 to 5, wherein a content of the transition metal in the upper layer is 10 at % or less.

(Structure 7)
The mask blank according to any one of structures 1 to 6, wherein an etching rate, with respect to a fluorine-containing substance, of the light-shielding film is 0.3 nm/sec or less in a state where the light-shielding film is not irradiated with charged particles.

(Structure 8)
The mask blank according to any one of structures 1 to 7, wherein a ratio obtained by dividing a content of the transition metal in the lower layer by a total content of the transition metal and the silicon in the lower layer and a nitrogen content in the lower layer are in ranges satisfying a condition of a formula (1) given by $$C_N \geq -0.00526 C_{Mo}^2 - 0.640 C_{Mo} + 26.624$$

where $C_{Mo}$ is the ratio obtained by dividing the content of the transition metal in the lower layer by the total content of the transition metal and the silicon in the lower layer and $C_N$ is the nitrogen content in the lower layer.

(Structure 9)
The mask blank according to any one of structures 1 to 8, wherein the light-shielding film has a thickness of 52 nm or less.

(Structure 10)
The mask blank according to any one of structures 1 to 9, wherein an etching mask film is provided on an upper surface of the light-shielding film and contains chromium and at least one of nitrogen and oxygen, and
a chromium content in the etching mask film is 50 at % or more.

(Structure 11)
A transfer mask manufactured using the mask blank according to any one of structures 1 to 10.

(Structure 12)
A transfer mask adapted to be applied with ArF excimer laser exposure light, comprising:
a transparent substrate; and
a light-shielding film formed on the transparent substrate, the light-shielding film having a transfer pattern;
wherein the light-shielding film has an at least two-layer structure comprising a lower layer and an upper layer from a side of the transparent substrate, the lower layer is made of a material composed of a transition metal, silicon, and nitrogen and having a nitrogen content of 21 at % or more and a refractive index n of 1.9 or less, the upper layer is made of a material composed of a transition metal, silicon, and nitrogen and having a refractive index n of 2.1 or less, and a surface layer of the upper layer contains oxygen and has a nitrogen content of 14 at % or more.

(Structure 13)

The transfer mask according to structure 12, wherein the lower layer is substantially free of oxygen.

(Structure 14)

The transfer mask according to structure 12 or 13, wherein a refractive index n of a material of the upper layer is greater than a refractive index n of a material of the lower layer.

(Structure 15)

The transfer mask according to any one of structures 12 to 14, wherein a material of the upper layer has an extinction coefficient k of 1.6 or less and a material of the lower layer has an extinction coefficient k of 2.2 or more.

(Structure 16)

The transfer mask according to any one of structures 12 to 15, wherein a difference between a ratio obtained by dividing a content of the transition metal in the lower layer by a total content of the transition metal and the silicon in the lower layer and a ratio obtained by dividing a content of the transition metal in the upper layer by a total content of the transition metal and the silicon in the upper layer is 4% or less.

(Structure 17)

The transfer mask according to any one of structures 12 to 16, wherein a content of the transition metal in the upper layer is 10 at % or less.

(Structure 18)

The transfer mask according to any one of structures 12 to 17, wherein an etching rate, with respect to a fluorine-containing substance, of the light-shielding film is 0.3 nm/sec or less in a state where the light-shielding film is not irradiated with charged particles.

(Structure 19)

The transfer mask according to any one of structures 12 to 18, wherein a ratio obtained by dividing a content of the transition metal in the lower layer by a total content of the transition metal and the silicon in the lower layer and a nitrogen content in the lower layer are in ranges satisfying a condition of a formula (1) given by $$C_N \geq -0.00526 C_{Mo}^2 - 0.640 C_{Mo} + 26.624$$

where $C_{Mo}$ is the ratio obtained by dividing the content of the transition metal in the lower layer by the total content of the transition metal and the silicon in the lower layer and $C_N$ is the nitrogen content in the lower layer.

(Structure 20)

The transfer mask according to any one of structures 12 to 19, wherein the transfer pattern of the light-shielding film includes a line and space pattern of half-pitch 40 nm or less.

(Structure 21)

A method of manufacturing the transfer mask using the mask blank according to any one of structures 1 to 10, comprising:

a step of forming a transfer pattern in the light-shielding film of the mask blank; and a defect correction step of making a comparison between a design transfer pattern and the transfer pattern formed in the light-shielding film and etching a defect portion, where the light-shielding film remains, by supplying a fluorine-containing substance to the defect portion and irradiating charged particles to the defect portion.

(Structure 22)

A method of manufacturing a semiconductor device, comprising:

forming a circuit pattern on a semiconductor wafer using the transfer mask according to any one of structures 12 to 20.

(Structure 23)

A method of manufacturing a semiconductor device, comprising:

forming a circuit pattern on a semiconductor wafer using the transfer mask manufactured by the method according to structure 21.

(Structure 24)

The method according to structure 22 or 23, wherein the circuit pattern formed on the semiconductor wafer includes a line and space pattern of half-pitch 40 nm or less.

According to this invention, it is possible to provide a mask blank which enables a defect correction technique using charged particle irradiation to be suitably applied to a transfer mask manufactured from the mask blank and which can make small a bias for the transfer mask due to an electromagnetic field (EMF) effect, and further to provide such a transfer mask, a method of manufacturing such a transfer mask, and a method of manufacturing a semiconductor device using such a transfer mask.

BRIEF DESCRIPTION OF THE DRAWINGS

FIG. 3 is a diagram showing the relationship between the Mo/(Mo+Si) ratio and the nitrogen content, which satisfies the optical density per predetermined unit thickness and so on.

DETAILED DESCRIPTION OF THE INVENTION

Hereinbelow, an embodiment of this invention will be described in detail with reference to the drawings.

This invention is a mask blank for use in the manufacture of a transfer mask adapted to be applied with ArF excimer laser exposure light, the mask blank comprising, on a transparent substrate, a light-shielding film for forming a transfer pattern, wherein the light-shielding film has an at least two-layer structure comprising a lower layer and an upper layer from the transparent substrate side, the lower layer is made of a material composed of a transition metal, silicon, and nitrogen and having a nitrogen content of 21 at % or more and a refractive index n of 1.9 or less, the upper layer is made of a material composed of a transition metal, silicon, and nitrogen and having a refractive index n of 2.1 or less, and a surface layer of the upper layer contains oxygen and has a nitrogen content of 14 at % or more.

Figure 1:
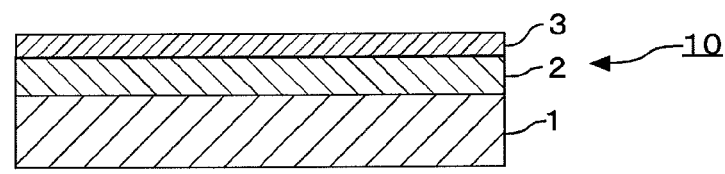
FIG. 1 is a cross-sectional view of an embodiment of a mask blank according to this invention.

FIG. 1 is a cross-sectional view of a mask blank 10 according to the embodiment of this invention. The mask blank 10 comprises a light-shielding film 2 on a transparent substrate 1. The transparent substrate 1 is not particularly limited as long as it has transparency for ArF excimer laser light. In this invention, a synthetic quartz substrate and various other glass substrates such as a $CaF_2$ substrate, a soda-lime glass substrate, an alkali-free glass substrate, and an aluminosilicate glass substrate can be used. Among them, the synthetic quartz substrate is particularly suitable for this invention because it has high transparency for ArF excimer laser light.

The etching rate of each of upper and lower layers of the light-shielding film 2 in EB defect correction tends to be lowered as the content of oxygen or nitrogen in the layer increases. That is, the etching rate of each of the upper and lower layers in the EB defect correction is largely affected by the content of oxygen or nitrogen in the layer. In particular, the etching rate in the EB defect correction is significantly lowered in the case where oxygen is contained as compared with the case where nitrogen is contained.

In order to achieve a predetermined or higher light-shielding performance (e.g. an optical density (OD) of 2.8 or more) over the entire light-shielding film 2 with a small total thickness, it is necessary to select a material with high light-shielding performance as the lower layer of the light-shielding film. Therefore, it is necessary to avoid as much as possible containing oxygen, which has a property of increasing the transmittance (a property of largely reducing the light-shielding performance), in the lower layer.

Accordingly, in this invention, each of the upper and lower layers is made of a material composed mainly of a transition metal, silicon, and nitrogen. That is, each of the upper and lower layers is prevented as much as possible from containing oxygen at least in the formation thereof. As a consequence, the etching rate difference between the upper and lower layers in the EB defect correction can be made smaller and, further, the total thickness of the light-shielding film can be made smaller (e.g. 52 nm or less).

If the nitrogen content of the material of the lower layer is smaller than 21 at %, the etching rate of the upper layer becomes significantly lower than that of the lower layer in the EB defect correction. If it takes much time to etch the upper layer for correction of a black defect portion by EB irradiation, the lower layer of a pattern portion adjacent to the black defect portion (e.g. the lower layer of a pattern portion adjacent to the black defect portion of the same pattern or the lower layer of a pattern adjacent to a pattern having the black defect portion), which is not a little affected by the EB irradiation, tends to be etched. As a consequence, a side wall of the lower layer of that pattern portion is largely retreated from an expected position so that there occurs a state where the lower layer is largely retreated laterally as compared with the upper layer (undercut).

In order to make small a bias due to the EMF effect, it is preferable to minimize the phase difference between exposure light transmitted through the light-shielding film 2 and exposure light transmitted in air for a distance equal to the thickness of the light-shielding film 2. In order to minimize the phase difference therebetween, it is preferable to minimize the refractive indices n of the materials of the upper and lower layers of the light-shielding film 2. From this point of view, the material of the lower layer is required to have a refractive index n of 1.9 or less. In order to set the refractive index n of the lower layer to 1.9 or less, it is preferable to set the nitrogen content in the lower layer to, for example, 28 at % or less. However, the refractive index n of the lower layer increases as the content of the transition metal increases. Therefore, it is preferable to change the upper limit of the nitrogen content in the lower layer in a range of about ±2 at % depending on the content of the transition metal in the lower layer.

On the other hand, even if the upper layer is formed in an atmosphere free of oxygen, it is difficult to avoid containing oxygen at least in its surface layer portion. Normally, after forming the light-shielding film 2, the surface of the light-shielding film 2 is cleaned. In this event, the surface layer of the light-shielding film 2 (i.e. the surface layer of the upper layer) is unavoidably oxidized. Further, after forming the light-shielding film 2 on the transparent substrate 1, there is a case where, in order to reduce the film stress of the light-shielding film 2, the light-shielding film 2 is heat-treated (annealed) at a temperature of, for example, 450° C. in the atmosphere. In this annealing, the surface layer portion of the upper layer is inevitably bonded to oxygen in the atmosphere, i.e. is oxidized. The thickness of the upper layer to be oxidized is a maximum of 3 nm and is preferably 2 nm or less.

Only with the surface layer oxidation of the upper layer to the extent described above, it is difficult to reduce the front-surface reflectance of the light-shielding film 2 for exposure light (ArF excimer laser light) to a predetermined value or less (e.g. 40% or less). However, there is a problem that if the upper layer contains too much oxygen, the etching rate of the upper layer is significantly reduced in the EB defect correction. Further, if the upper layer contains too much oxygen, the light-shielding performance (extinction coefficient k) of the upper layer is also significantly reduced so that the total thickness of the light-shielding film 2 becomes large. There is also a problem that if the total thickness of the light-shielding film 2 becomes large, a bias due to the EMF effect becomes large. Taking these into account, the upper layer preferably has the front-surface antireflection function by containing nitrogen. However, as the nitrogen content in the upper layer increases, the refractive index n of the upper layer increases. As described above, in order to make small the bias due to the EMF effect, it is preferable to also minimize the refractive index n of the upper layer. However, in order to ensure the front-surface antireflection function of the upper layer, the refractive index n of the upper layer should be set greater than that of the lower layer. Taking these into account, the refractive index n of the upper layer should be 2.1 or less.

In order to set the refractive index n of the upper layer to 2.1 or less, it is preferable to set the nitrogen content in the upper layer to, for example, 30 at % or less. However, the refractive index n of the upper layer changes depending on the contents of the transition metal and oxygen in the upper layer. Therefore, it is preferable to change the upper limit of the nitrogen content in the upper layer in a range of about ±2 at % depending on the contents of the transition metal and oxygen in the upper layer. The nitrogen content in the upper layer is preferably higher than 21 at %.

On the other hand, in the EB defect correction, the surface of the upper layer is continuously exposed to a fluorine-containing substance such as a xenon difluoride gas. If the surface layer of the upper layer has an oxygen content as low as that which is caused by the surface layer oxidation in the process such as the cleaning or the annealing as described above, and has a still lower nitrogen content, there is a possibility that etching proceeds from the surface of the upper layer to cause a film loss or the like due to the fluorine-containing substance such as the xenon difluoride gas so that defects such as pinholes may be formed on the surface of the upper layer. Since the upper layer is basically a film serving as a front-surface antireflection layer, there is a possibility that, as a result of a reduction in the in-plane uniformity of the front-surface reflectance, an adverse influence is exerted on pattern exposure and transfer to a resist film or the like on a semiconductor wafer using a completed transfer mask. Taking these into account, the surface layer of the upper layer not only contains oxygen, but also should have a nitrogen content of 14 at % or more.

In order for the nitrogen content in the surface layer of the upper layer to be 14 at % or more, the nitrogen content in a portion other than the surface layer should be at least 14 at % or more. This makes it possible to prevent the etching rate of the upper layer in the EB defect correction from becoming too high due to the nitrogen content in the material of the upper layer being too low. Further, it is also possible to avoid a possibility that an edge portion of a transfer pattern of the upper layer is etched while etching the lower layer so that the line edge roughness is degraded.

Of the upper and lower layers forming the light-shielding film 2, the lower layer is substantially free of oxygen as described above. Herein, "substantially free of oxygen" represents that oxygen is positively prevented from being contained. Specifically, "substantially free of oxygen" includes the case where oxygen is inevitably contained due to contamination or the like and represents that the oxygen content is 5 at % or less. It is preferable that the upper layer be also substantially free of oxygen at its portion other than its surface layer As described above, in the light-shielding film 2, the refractive index n of the material of the upper layer is 2.1 or less and the refractive index n of the material of the lower layer is 1.9 or less. If the refractive indices n of the upper and lower layers are in these ranges, as seen from the results of simulation which will be described later, a bias due to the EMF effect upon irradiation of exposure light by annular illumination onto a line & space pattern of half-pitch 40 nm formed in the light-shielding film 2 can be made 20 nm or less. Further, a bias due to the EMF effect upon irradiation of exposure light by dipole illumination onto a line & space pattern of half-pitch 40 nm formed in the light-shielding film 2 can be made 3.0 nm or less.

In order to make small a bias due to the EMF effect, the upper layer is preferably made of a material with an extinction coefficient k of 1.6 or less while the lower layer is preferably made of a material with an extinction coefficient k of 2.2 or more. If the extinction coefficients k of the upper and lower layers are in these ranges, as seen from the results of simulation which will be described later, a bias due to the EMF effect upon irradiation of exposure light by annular illumination onto a line & space pattern of half-pitch 40 nm formed in the light-shielding film 2 can be made 20 nm or less.

The difference between the ratio obtained by dividing the content of the transition metal in the lower layer by the total content of the transition metal and silicon in the lower layer and the ratio obtained by dividing the content of the transition metal in the upper layer by the total content of the transition metal and silicon in the upper layer is preferably 4% or less. By making the compositions of the materials of the upper and lower layers as close to each other as possible as described above, the ratio of the etching rate of the lower layer to that of the upper layer can be made as close to 1.0 as possible in the EB defect correction. As a consequence, it is possible to prevent that while etching the upper layer, the side wall of the lower layer is largely retreated from an expected position so that there occurs a state where the lower layer is largely retreated laterally as compared with the upper layer (undercut). The difference between the ratio obtained by dividing the content of the transition metal in the lower layer by the total content of the transition metal and silicon in the lower layer and the ratio obtained by dividing the content of the transition metal in the upper layer by the total content of the transition metal and silicon in the upper layer is more preferably 3% or less and further preferably 2% or less.

Taking into account only the light-shielding performance, the nitrogen content in the lower layer is preferably low. This is because if the nitrogen content becomes large, the light-shielding performance of the lower layer decreases although not comparable with the case where oxygen is contained. However, when the EB defect correction is taken into account, nitrogen should be contained also in the lower layer in a predetermined amount or more. The reason is that since nitrogen is contained in the material of the upper layer, nitrogen should be contained also in the material of the lower layer, thereby making the ratio of the etching rate of the lower layer to that of the upper layer as close to 1.0 as possible in the EB defect correction.

Figure 3:
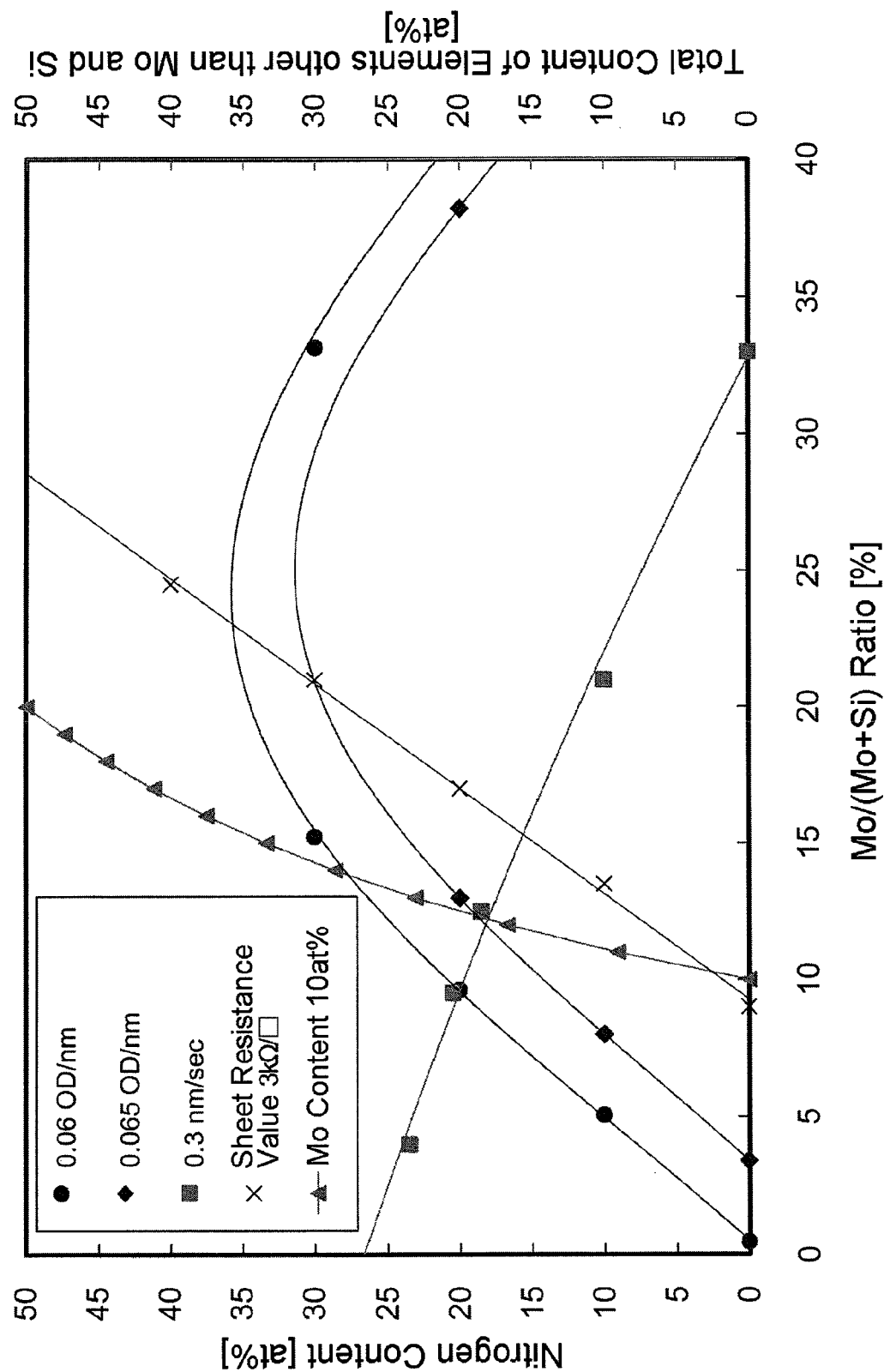

FIG. 3 is a graph showing a range where the etching rate, with respect to a fluorine-containing substance, of a thin film (a lower or upper layer of a light-shielding film) made of a material containing molybdenum, silicon, and nitrogen becomes 0.3 nm/sec or less in the state where the thin film is not irradiated with charged particles such as an electron beam. In the graph of FIG. 3, the abscissa axis represents the ratio obtained by dividing the molybdenum content [at %] in the thin film by the molybdenum and silicon total content [at %] in the thin film (i.e. the ratio, given in percent [%], of the molybdenum content [at %] in the thin film when the molybdenum and silicon total content [at %] in the thin film is given as 100; hereinafter referred to as a "Mo/(Mo+Si) ratio"). In the graph of FIG. 3, the ordinate axis on the left side represents the nitrogen content [at %] in the thin film. In FIG. 3, the etching rate, with respect to the fluorine-containing substance, of the thin film with the Mo/(Mo+Si) ratio and the nitrogen content in a graph region above an approximate curve of "■0.3 nm/sec" plots becomes 0.3 nm/sec or less in the state where the thin film is not irradiated with charged particles.

While carrying out EB defect correction of a black defect portion, the fluorine-containing substance in a gaseous state is supplied to the black defect portion. Therefore, the gas of the fluorine-containing substance spreads centering around the black defect portion to be brought into contact with a nearby pattern side wall of the thin film. Even if not irradiated with charged particles, the thin film is etched by the gas of the fluorine-containing substance. In this event, if the etching rate, with respect to the fluorine-containing substance, of the thin film is greater than 0.3 nm/sec in the state where the thin film is not irradiated with charged particles, there is a possibility that the pattern side wall is etched while the EB defect correction of the black defect portion is carried out. The upper layer serves to reduce the front-surface reflectance and thus contains much nitrogen. Therefore, basically, the nitrogen content in the upper layer is in the range where the etching rate, with respect to the fluorine-containing substance, of the upper layer is 0.3 nm/sec or less in the state where the upper layer is not irradiated with charged particles.

On the other hand, the nitrogen content in the lower layer is not necessarily in the range where the etching rate, with respect to the fluorine-containing substance, of the lower layer is 0.3 nm/sec or less in the state where the lower layer is not irradiated with charged particles. Accordingly, it is necessary to adjust the nitrogen content in the lower layer so as to fall in the range where the etching rate, with respect to the fluorine-containing substance, of the lower layer is 0.3 nm/sec or less in the state where the lower layer is not irradiated with charged particles. An approximate curve formula of the range where the etching rate, with respect to the fluorine-containing substance, of the thin film is 0.3 nm/sec or less in the state where the thin film is not irradiated with charged particles in FIG. 3 is, for example, $C_N = -0.00526 C_{Mo}^2 - 0.640 C_{Mo} + 26.624$, where $C_{Mo}$ is the Mo/(Mo+Si) ratio in the thin film and $C_N$ is the nitrogen content in the thin film. This approximate curve formula is calculated based on five plots in FIG. 3 and thus more or less changes depending on a calculation method. However, the influence upon etching rates due to the movement of boundary lines of composition ratios satisfying certain etching rates caused by such a change of the approximate curve formula is small in an allowable range.

The light-shielding performance (optical density) required for the light-shielding film 2 should be substantially ensured by the lower layer. In order to ensure most of the optical density of the entire light-shielding film 2 by the lower layer, the optical density (OD) per unit thickness of the material of the lower layer is preferably 0.06 nm$^{-1}$ (wavelength: 193 nm) or more and more preferably 0.065 nm$^{-1}$ (wavelength: 193 nm) or more. FIG. 3 shows approximate curves obtained by plotting the Mo/(Mo+Si) ratios and the nitrogen contents of light-shielding films (lower layers) whose optical densities per unit thickness are predetermined values (0.06 nm$^{-1}$, 0.065 nm$^{-1}$).

In FIG. 3, for example, a region below and including the 0.06 nm$^{-1}$ approximate curve (approximate curve of "●0.06 OD/nm" plots) represents a composition range where a light-shielding film (lower layer) with an optical density of 0.06 nm$^{-1}$ or more per unit thickness can be formed. This approximate curve formula is, for example, $C_N = -3.63 \times 10^{-7} C_{Mo}^5 + 7.60 \times 10^{-5} C_{Mo}^4 - 4.67 \times 10^{-3} C_{Mo}^3 + 5.06 \times 10^{-2} C_{Mo}^2 + 2.082 C_{Mo} + 1.075$. Further, with respect to the Mo/(Mo+Si) ratio and the nitrogen content that can form a light-shielding film (lower layer) with an optical density of 0.065 nm$^{-1}$ or more per unit thickness, it is necessary to satisfy the condition of a composition range in a region below and including the 0.065 nm$^{-1}$ approximate curve (approximate curve of "♦0.065 OD/nm" plots) shown in FIG. 3. This approximate curve formula is, for example, $C_N = -3.0 \times 10^{-7} C_{Mo}^5 + 7.0 \times 10^{-5} C_{Mo}^4 - 5.0 \times 10^{-3} C_{Mo}^3 + 8.2 \times 10^{-2} C_{Mo}^2 + 1.722 C_{Mo} - 6.621$. These approximate curve formulas are each calculated based on five plots in FIG. 3 and thus more or less change depending on a calculation method. However, the influence upon optical densities due to the movement of boundary lines of composition ratios satisfying certain optical densities caused by such a change of the approximate curve formula is small in an allowable range.

From the corresponding approximate curve in FIG. 3, it is seen that, in order to simultaneously satisfy the two conditions where the optical density per unit thickness of the light-shielding film (lower layer) is 0.06 nm$^{-1}$ or more and where the etching rate, with respect to the fluorine-containing substance, of the light-shielding film (lower layer) becomes 0.3 nm/sec or less in the state where the light-shielding film (lower layer) is not irradiated with charged particles, the Mo/(Mo+Si) ratio should be 9% or more. Further, it is seen that, in order to simultaneously satisfy the two conditions where the optical density per unit thickness of the light-shielding film (lower layer) is 0.065 nm$^{-1}$ or more and where the etching rate, with respect to the fluorine-containing substance, of the light-shielding film (lower layer) becomes 0.3 nm/sec or less in the state where the light-shielding film (lower layer) is not irradiated with charged particles, the Mo/(Mo+Si) ratio should be 12% or more.

As the transition metal contained in the material of the lower layer, use can be made of molybdenum, tantalum, tungsten, titanium, chromium, hafnium, nickel, vanadium, zirconium, ruthenium, rhodium, niobium, palladium, or the like. With respect to the ratio obtained by dividing the transition metal content [at %] in the lower layer by the transition metal and silicon total content [at %] in the lower layer (i.e. the ratio, given in percent [%], of the transition metal content [at %] in the lower layer when the transition metal and silicon total content [at %] in the lower layer is given as 100; hereinafter referred to as a "M/(M+Si) ratio" where M is a transition metal), the description has been given of molybdenum in the above-mentioned example, but approximately the same tendency is shown for the other listed transition metals.

The total thickness of the light-shielding film 2 is preferably suppressed to 52 nm or less and more preferably 51 nm or less. This makes it possible to suppress a bias due to the EMF effect. If the bias due to the EMF effect is large, it seriously affects the CD accuracy of the line width of a transfer pattern onto a resist on a semiconductor wafer. In order to set the total thickness of the light-shielding film 2 to 52 nm or less, the optical density of the lower layer per unit thickness is preferably set to 0.06 nm$^{-1}$ or more and more preferably 0.065 nm$^{-1}$ or more. As described above, the upper layer should have the front-surface antireflection function and thus should be made of a material having a higher refractive index n than that of the lower layer. Accordingly, the thickness of the upper layer is preferably set to less than 5 nm and more preferably 4 nm or less. In order to provide the upper layer with a certain or higher front-surface antireflection function for ArF exposure light, the thickness of the upper layer should be at least 2 nm or more and is preferably 3 nm or more.

In order to reduce the front-surface reflectance while reducing the thickness of the entire light-shielding film 2, it is preferable to use a film structure which utilizes an optical interference effect. Utilizing the optical interference effect is to cause interference between exposure light reflected by the interface between the upper layer and air and exposure light having passed through the interface between the upper layer and the air and reflected by the interface between the upper layer and the lower layer to attenuate them, thereby reducing the reflection of the exposure light from the surface of the light-shielding film 2. In order to produce this optical interference effect, it is necessary that the composition in the interface vicinity in the upper layer on the lower layer side and the composition in the interface vicinity in the lower layer on the upper layer side differ from each other (it is necessary that the interface between the upper layer and the lower layer be distinct to some extent). Further, in order to utilize this optical interference effect, it is preferable that the composition gradient in the upper layer at its portion other than its surface layer be small in its thickness direction and it is more preferable that there be no composition gradient other than that due to a film forming process factor or due to surface oxidation caused by annealing or the like.

As the fluorine-containing substance which is supplied to the target portion (black defect portion) in the EB defect correction, use can be made of $XeF_2$, $XeF_4$, $XeF_6$, $XeOF_2$, $XeOF_4$, $XeO_2F_2$, $XeO_3F_2$, $XeO_2F_4$, $ClF_3$, $ClF$, $BrF_5$, $BrF$, $IF_3$, $IF_5$, $KrF$, $ArF$, or the like. Among them, $XeF_2$ is preferable. The fluorine-containing substance is preferably supplied in a gaseous state to the target portion.

In a thin film containing a transition metal and silicon, the tendencies of the change in etching rate with respect to the oxygen or nitrogen content in the thin film differ between the case of etching for EB defect correction and the case of etching by a fluorine-based gas in a plasma state, i.e. normal dry etching. In the case of the EB defect correction, as the oxygen or nitrogen content in the thin film increases, i.e. the silicon oxide or nitride content in the thin film increases, the etching rate tends to be lowered. On the other hand, in the case of the normal dry etching by the fluorine-based gas plasma, even if the oxygen or nitrogen content in the thin film increases, the etching rate does not substantially change or the etching rate tends to increase depending on the transition metal content. Therefore, the tendency of the etching rate in the case of the dry etching by the fluorine-based gas in the excited state (plasma state) for the thin film containing the transition metal and silicon hardly serves as reference for adjusting the etching rate in the EB defect correction which irradiates charged particles while supplying a fluorine-based gas in an unexcited state.

As the transition metal contained in the material of the upper layer, use can be made of molybdenum, tantalum, tungsten, titanium, chromium, hafnium, nickel, vanadium, zirconium, ruthenium, rhodium, or the like. Among them, molybdenum is preferable. The transition metal content in the upper layer is preferably 10 at % or less. If the transition metal content in the upper layer is higher than 10 at %, when a transfer mask is manufactured from this mask blank, the resistance to mask cleaning (alkaline cleaning with an ammonia hydrogen peroxide mixture, or hot water cleaning) is low so that there is a possibility of the occurrence of a change in optical properties (an increase in front-surface reflectance) due to dissolution of the upper layer or a degradation in line edge roughness or CD accuracy due to a change in the shape of a transfer pattern edge portion. This tendency is particularly significant when molybdenum is used as the transition metal in the upper layer. In particular, in the case where molybdenum is used as the transition metal in the upper layer, when a heat treatment (annealing) is carried out at a high temperature for the stress control of the light-shielding film, if the transition metal content of the upper layer (front-surface antireflection layer) is high, there occurs a phenomenon that the surface is clouded white (becomes cloudy). This is considered to be because molybdenum oxide is precipitated on the surface. In order to also suppress such a phenomenon, the transition metal content of the upper layer is preferably 10 at % or less. FIG. 3 shows a curve obtained by plotting the Mo/(Mo+Si) ratios and the total contents of elements other than molybdenum and silicon of light-shielding films (upper layers) each having a molybdenum content of 10 at %. This curve is given by $C_{Others}=100-1000/C_{Mo}$, where $C_{Others}$ is the total content of elements other than molybdenum and silicon in the light-shielding film (upper layer). In FIG. 3, a region on the left side of and including the curve "▲Mo Content 10 at %" represents that the molybdenum content in each light-shielding film (upper layer) is 10 at % or less.

Figure 2A:
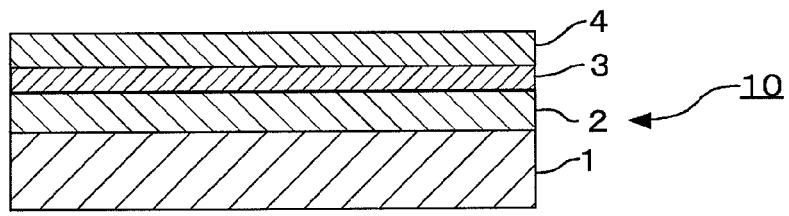
FIGS. 2A to 2F are cross-sectional views showing processes of manufacturing a transfer mask using the embodiment of the mask blank according to this invention.
Figure 2B:
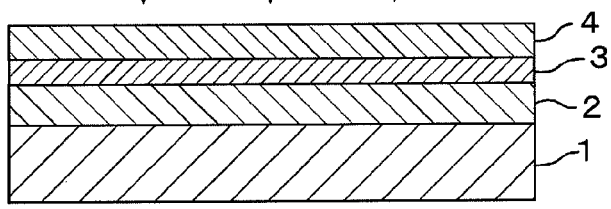
Figure 2C:
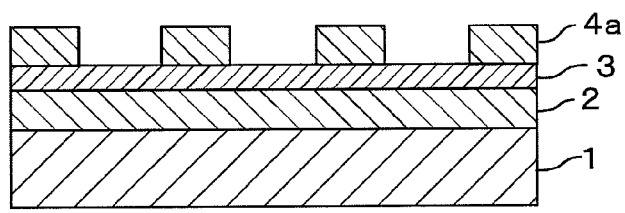

There is a tendency that silicon containing nitrogen or oxygen has a low conductivity (a high sheet resistance value). Therefore, in a light-shielding film containing a transition metal, silicon, and nitrogen or oxygen, it is necessary to increase the transition metal content in the film in order to increase the conductivity. In the manufacture of a transfer mask from the mask blank, as shown in FIGS. 2A to 2C, a resist film 4 is coated on the light-shielding film 2 (on an etching mask film 3), a design pattern is exposed and transferred to the resist film 4, and then the resist film 4 is developed and cleaned, thereby forming a resist pattern 4a. In recent years, use has been made of a method which applies a resist for electron beam writing exposure to this resist film and irradiates an electron beam for writing (electron beam exposure writing), thereby exposing a design pattern.

In this electron beam writing exposure, in terms of writing position accuracy and charge-up, the thin film under the resist film 4 (in the case of the structure comprising the light-shielding film 2 and the etching mask film 3, at least one of the light-shielding film 2 and the etching mask film 3) is required to be conductive. Specifically, it is desired that the sheet resistance value of at least one of the light-shielding film 2 and the etching mask film 3 be 3 kΩ/square or less.

The optical density of a light-shielding film for use in a binary mask blank should be at least 2.3 or more and is preferably 2.5 or more. However, in the case of a binary mask blank for producing a binary transfer mask for use in the double exposure technique or the like, if the optical density of a light-shielding film is as low as only 2.3 or 2.5, there may arise a problem due to leakage light at overlapping exposure portions of a resist on a wafer. Taking this into account, the optical density of the light-shielding film is preferably 2.8 or more and more preferably 3.0 or more.

The light-shielding film of this invention is required to have the at least two-layer structure comprising the upper layer and the lower layer, and may have a laminated structure of three layers or more. For example, in the case of a three-layer structure comprising a lowermost layer, an intermediate layer, and an uppermost layer, the upper layer of this invention may be applied to the uppermost layer and the lower layer of this invention may be applied to the intermediate layer, thereby applying the relationship between the upper layer and the lower layer of this invention to the relationship between the uppermost layer and the intermediate layer. Alternatively, the upper layer of this invention may be applied to the intermediate layer and the lower layer of this invention may be applied to the lowermost layer, thereby applying the relationship between the upper layer and the lower layer of this invention to the relationship between the intermediate layer and the lowermost layer.

This invention also provides a method of manufacturing a transfer mask, comprising an etching process of patterning, by etching, the light-shielding film in the mask blank obtained by this invention and a defect correction process of correcting a black defect portion using the EB defect correction technique. As the etching in the etching process, dry etching effective for forming a fine pattern is preferably used.

As shown in FIG. 1, the mask blank according to this invention may also be the mask blank 10 having the light-shielding film 2 on the transparent substrate 1 and further having the etching mask film 3 on the light-shielding film 2.

In this invention, in order to ensure etching selectivity to the light-shielding film 2 in dry etching for patterning the light-shielding film 2 to form a transfer pattern, the etching mask film 3 is preferably made of, for example, a material containing chromium and at least one of nitrogen and oxygen. By providing such an etching mask film 3 on the light-shielding film 2, it is possible to achieve a reduction in the thickness of a resist film to be formed on the mask blank. The etching mask film 3 may further contain a component such as carbon. Specifically, for example, use can be made of a material such as CrN, CrON, CrOC, or CrOCN.

In recent years, use has been made of a method which applies a resist for electron beam writing exposure to the resist film 4 and irradiates an electron beam for writing (electron beam exposure writing), thereby exposing a design pattern. In this electron beam writing exposure, in terms of writing position accuracy and charge-up, at least one of the light-shielding film 2 and the etching mask film 3 is required to have a certain or higher conductivity. Specifically, it is desired that the sheet resistance value of at least one of the light-shielding film 2 and the etching mask film 3 be 3 Ω/square or less. FIG. 3 shows an approximate straight line (approximate straight line of "×Sheet Resistance Value 3Ω/□" plots) obtained by plotting the Mo/(Mo+Si) ratios and the nitrogen contents of light-shielding films (lower layers) each having a sheet resistance value of 3 Ω/square. This approximate straight line formula is, for example, $C_N=2.593C_{Mo}-24.074$. In FIG. 3, a region on the right side of the approximate straight line represents a composition range where a light-shielding film (lower layer) with a sheet resistance value of 3 Ω/square or less can be formed.

When the sheet resistance value of the light-shielding film 2 is 3 Ω/square or less, even if the sheet resistance value of the etching mask film 3 is high, electron beam writing can be carried out without causing charge-up. In order to reduce the thickness of the resist film 4, it is desirable to improve the etching rate, in dry etching, of the etching mask film 3 with respect to a mixed gas of chlorine and oxygen. For this, the metal component (chromium) content is preferably set to less than 50 at %, more preferably 45 at % or less, and further preferably 40 at % or less.

On the other hand, when the sheet resistance value of the light-shielding film 2 is greater than 3 Ω/square, the sheet resistance value of the etching mask film 3 should be set to 3 Ω/square or less. In this case, when the etching mask film 3 has a single-layer structure, the chromium content in the etching mask film 3 is preferably 50 at % or more and more preferably 60 at % or more. When the etching mask film 3 has a laminated structure of a plurality of layers, the chromium content of at least the layer on the side to be in contact with the resist film 4 is preferably set to 50 at % or more (more preferably 60 at % or more) while the chromium content of the layer on the light-shielding film 2 side is preferably set to less than 50 at % (more preferably 45 at % or less and further preferably 40 at % or less). The etching mask film 3 may have a composition gradient structure in which the chromium content increases from the light-shielding film 2 side toward the side to be in contact with the resist film 4 (excluding a surface layer, to be in contact with the resist film 4, where a reduction in chromium content due to surface oxidation cannot be avoided). In this case, in the etching mask film 3, the chromium content is preferably less than 50 at % (more preferably 45 at % or less and further preferably 40 at % or less) at its portion where the chromium content is lowest and is preferably 50 at % or more (more preferably 60 at % or more) at its portion where the chromium content is highest.

The thickness of the etching mask film 3 is preferably 5 nm or more and 20 nm or less. If the thickness is less than 5 nm, the film loss of the etching mask film 3 proceeds in a pattern edge direction before completion of dry etching of the light-shielding film 2 using an etching mask film pattern as a mask so that there is a possibility that the CD accuracy of a pattern transferred to the light-shielding film 2 with respect to a design pattern is largely degraded. On the other hand, if the thickness is greater than 20 nm, the resist film thickness required for transferring a design pattern to the etching mask film 3 becomes large so that it is difficult to accurately transfer a fine pattern to the etching mask film 3.

EXAMPLES

Hereinbelow, the embodiment of this invention will be described in further detail with reference to Examples. In addition, a Reference Example and Comparative Examples with respect to the Examples will also be described.

Example 1

In a single-wafer sputtering apparatus, using a mixed target of molybdenum (Mo) and silicon (Si) (at % ratio Mo:Si=13:87) as a sputtering target, reactive sputtering (DC sputtering) was carried out in a mixed gas atmosphere of argon and nitrogen, thereby forming a MoSiN film (lower layer (light-shielding layer)) to a thickness of 47 nm on a transparent substrate 1 made of synthetic quartz glass. Then, using a Mo/Si target (at % ratio Mo:Si=13:87), reactive sputtering (DC sputtering) was carried out in a mixed gas atmosphere of argon and nitrogen, thereby forming a MoSiN film (upper layer (front-surface antireflection layer)) to a thickness of 4 nm on the lower MoSiN film. In this manner, a light-shielding film 2 (total thickness: 51 nm) for ArF excimer laser light (wavelength: 193 nm) was formed.

Then, the substrate 1 with the light-shielding film 2 was heat-treated (annealed) at 450° C. for 30 minutes, thereby reducing the film stress of the light-shielding film 2. A substrate 1 with a light-shielding film 2 was manufactured in the same manner as described above, including annealing, and then was subjected to X-ray photoelectron spectroscopy (XPS/ESCA) (RBS correction was applied to analysis values; the same shall apply to other analyses hereinafter). As a result, it was confirmed that the light-shielding film 2 had a film composition of the lower layer (Mo: 9.2 at %, Si: 68.3 at %, N: 22.5 at %) and the upper layer (Mo: 5.8 at %, Si: 64.4 at %, N: 27.7 at %, O: 2.1 at %) in the vicinity of the lower layer side. The result of X-ray photoelectron spectroscopy (XPS/ESCA) of a surface layer of the upper layer was such that nitrogen was 14.4 at % and oxygen was 38.3 at %. The refractive index n of the lower layer was 1.88 and the extinction coefficient k thereof was 2.20. The refractive index n of the upper layer was 2.07 and the extinction coefficient k thereof was 1.14.

Example 2

In a single-wafer sputtering apparatus, using a mixed target of molybdenum (Mo) and silicon (Si) (at % ratio Mo:Si=13:87) as a sputtering target, reactive sputtering (DC sputtering) was carried out in a mixed gas atmosphere of argon and nitrogen, thereby forming a MoSiN film (lower layer (light-shielding layer)) to a thickness of 46 nm on a transparent substrate 1 made of synthetic quartz glass. Then, using a Mo/Si target (at % ratio Mo:Si=13:87), reactive sputtering (DC sputtering) was carried out in a mixed gas atmosphere of argon and nitrogen, thereby forming a MoSiN film (upper layer (front-surface antireflection layer)) to a thickness of 3 nm on the lower MoSiN film. In this manner, a light-shielding film 2 (total thickness: 49 nm) for ArF excimer laser light (wavelength: 193 nm) was formed.

Then, the substrate 1 with the light-shielding film 2 was heat-treated (annealed) at 450° C. for 30 minutes, thereby reducing the film stress of the light-shielding film 2. A substrate 1 with a light-shielding film 2 was manufactured in the same manner as described above, including annealing, and then was subjected to X-ray photoelectron spectroscopy (XPS/ESCA). As a result, it was confirmed that the light-shielding film 2 had a film composition of the lower layer (Mo: 9.5 at %, Si: 68.7 at %, N: 21.8 at %) and the upper layer (Mo: 6.1 at %, Si: 67.7 at %, N: 21.7 at %, O: 4.5 at %) in the vicinity of the lower layer side. The result of X-ray photoelectron spectroscopy (XPS/ESCA) of a surface layer of the upper layer was such that nitrogen was 14.4 at % and oxygen was 38.3 at %. The refractive index n of the lower layer was 1.81 and the extinction coefficient k thereof was 2.22. The refractive index n of the upper layer was 1.97 and the extinction coefficient k thereof was 1.59.

Reference Example 1

In a single-wafer sputtering apparatus, using a mixed target of molybdenum (Mo) and silicon (Si) (at % ratio Mo:Si=13:87) as a sputtering target, reactive sputtering (DC sputtering) was carried out in a mixed gas atmosphere of argon and nitrogen, thereby forming a MoSiN film (lower layer (light-shielding layer)) to a thickness of 47 nm on a transparent substrate 1 made of synthetic quartz glass. Then, using a Mo/Si target (at % ratio Mo:Si=13:87), reactive sputtering (DC sputtering) was carried out in a mixed gas atmosphere of argon and nitrogen, thereby forming a MoSiN film (upper layer (front-surface antireflection layer)) to a thickness of 13 nm on the lower MoSiN film. In this manner, a light-shielding film 2 (total thickness: 60 nm) for ArF excimer laser light (wavelength: 193 nm) was formed.

Then, the substrate 1 with the light-shielding film 2 was heat-treated (annealed) at 450° C. for 30 minutes, thereby reducing the film stress of the light-shielding film 2. A substrate 1 with a light-shielding film 2 was manufactured in the same manner as described above, including annealing, and then was subjected to X-ray photoelectron spectroscopy (XPS/ESCA). As a result, it was confirmed that the light-shielding film 2 had a film composition of the lower layer (Mo: 9.0 at %, Si: 63.6 at %, N: 27.4 at %) and the upper layer (Mo: 6.2 at %, Si: 54.0 at %, N: 39.8 at %) in the vicinity of the lower layer side. The result of X-ray photoelectron spectroscopy (XPS/ESCA) of a surface layer of the upper layer was such that nitrogen was 21.2 at % and oxygen was 22.3 at %. The refractive index n of the lower layer was 2.28 and the extinction coefficient k thereof was 2.00. The refractive index n of the upper layer was 2.37 and the extinction coefficient k thereof was 0.98.

Comparative Example 1

In a single-wafer sputtering apparatus, using a mixed target of molybdenum (Mo) and silicon (Si) (at % ratio Mo:Si=13:87) as a sputtering target, reactive sputtering (DC sputtering) was carried out in a mixed gas atmosphere of argon and nitrogen, thereby forming a MoSiN film (lower layer (light-shielding layer)) to a thickness of 32 nm on a transparent substrate 1 made of synthetic quartz glass. Then, using a Mo/Si target (at % ratio Mo:Si=13:87), reactive sputtering (DC sputtering) was carried out in a mixed gas atmosphere of argon and nitrogen, thereby forming a MoSiN film (upper layer (front-surface antireflection layer)) to a thickness of 12 nm on the lower MoSiN film. In this manner, a light-shielding film 2 (total thickness: 44 nm) for ArF excimer laser light (wavelength: 193 nm) was formed.

Then, the substrate 1 with the light-shielding film 2 was heat-treated (annealed) at 300° C. for 30 minutes, thereby reducing the film stress of the light-shielding film 2. A substrate 1 with a light-shielding film 2 was manufactured in the same manner as described above, including annealing, and then was subjected to X-ray photoelectron spectroscopy (XPS/ESCA). As a result, it was confirmed that the light-shielding film 2 had a film composition of the lower layer (Mo: 10.8 at %, Si: 79.0 at %, N: 10.2 at %) and the upper layer (Mo: 6.6 at %, Si: 73.8 at %, N: 19.6 at %) in the vicinity of the lower layer side. The result of X-ray photoelectron spectroscopy (XPS/ESCA) of a surface layer of the upper layer was such that nitrogen was 12.7 at % and oxygen was 31.1 at %. The refractive index n of the lower layer was 1.64 and the extinction coefficient k thereof was 2.60. The refractive index n of the upper layer was 2.26 and the extinction coefficient k thereof was 2.11.

Comparative Example 2

In a single-wafer sputtering apparatus, using a mixed target of molybdenum (Mo) and silicon (Si) (at % ratio Mo:Si=13:87) as a sputtering target, reactive sputtering (DC sputtering) was carried out in a mixed gas atmosphere of argon and nitrogen, thereby forming a MoSiN film (lower layer (light-shielding layer)) to a thickness of 44 nm on a transparent substrate 1 made of synthetic quartz glass. Then, using a Mo/Si target (at % ratio Mo:Si=13:87), reactive sputtering (DC sputtering) was carried out in a mixed gas atmosphere of argon and nitrogen, thereby forming a MoSiN film (upper layer (front-surface antireflection layer)) to a thickness of 4 nm on the lower MoSiN film. In this manner, a light-shielding film 2 (total thickness: 48 nm) for ArF excimer laser light (wavelength: 193 nm) was formed.

Then, the substrate 1 with the light-shielding film 2 was heat-treated (annealed) at 450° C. for 30 minutes, thereby reducing the film stress of the light-shielding film 2. A substrate 1 with a light-shielding film 2 was manufactured in the same manner as described above, including annealing, and then was subjected to X-ray photoelectron spectroscopy (XPS/ESCA). As a result, it was confirmed that the light-shielding film 2 had a film composition of the lower layer (Mo: 9.8 at %, Si: 70.4 at %, N: 19.8 at %) and the upper layer (Mo: 6.3 at %, Si: 69.4 at %, N: 20.9 at %, O: 3.4 at %) in the vicinity of the lower layer side. The result of X-ray photoelectron spectroscopy (XPS/ESCA) of a surface layer of the upper layer was such that nitrogen was 14.2 at % and oxygen was 37.9 at %. The refractive index n of the lower layer was 1.63 and the extinction coefficient k thereof was 2.37. The refractive index n of the upper layer was 1.94 and the extinction coefficient k thereof was 1.23.

Then, an etching mask film 3 was formed on an upper surface of each of the light-shielding films 2 obtained in Examples 1 and 2, Reference Example 1, and Comparative Examples 1 and 2. Specifically, in a single-wafer sputtering apparatus, using a chromium (Cr) target, reactive sputtering (DC sputtering) was carried out in a mixed gas atmosphere of argon and nitrogen, thereby forming a CrN film (composition ratio Cr: 75.3 at %, N: 24.7 at %) to a thickness of 5 nm. Further, the etching mask film 3 (CrN film) was annealed at a temperature lower than the annealing temperature of the light-shielding film 2, thereby adjusting the film stress of the etching mask film 3 to be as small as possible (preferably, substantially zero) without affecting the film stress of the light-shielding film 2. In the manner described above, binary mask blanks 10 of Examples 1 and 2, Reference Example 1, and Comparative Examples 1 and 2 were obtained.

Then, optical simulation for calculating an EMF bias was carried out for each of the light-shielding films 2 of the mask blanks 10 obtained in Examples 1 and 2, Reference Example 1, and Comparative Examples 1 and 2.

In the optical simulation, the refractive indices n, the extinction coefficients k, and the thicknesses d obtained in the above-mentioned Examples, Reference Example, and Comparative Examples were used as input values.

As a design pattern to be applied to the optical simulation, a line & space pattern of DRAM half-pitch (hp) 40 nm was used.

As the illumination conditions of exposure light to be applied to the optical simulation, two conditions of dipole illumination and annular illumination were set.

An EMF bias was calculated by obtaining a difference between a bias (correction amount) calculated by TMA optical simulation and a bias (correction amount) calculated by simulation taking into account an EMF effect.

Table 1 below shows the results of the optical simulation.

TABLE 1

| | | Example 1 | Example 2 | Reference Example 1 | Comparative Example 1 | Comparative Example 2 |
|---|---|---|---|---|---|---|
| EMF Bias [nm] | Dipole Illumination | 2.47 | 2.04 | 5.5 | 3.2 | 1.15 |
| | Annular Illumination | 17.93 | 16.43 | 40.0 | 24.2 | 13.43 |

As is seen from the results shown in Table 1, with respect to each of the light-shielding films 2 obtained in Examples 1 and 2 and Comparative Example 2, the EMF bias in the dipole illumination was 3.0[nm] or less and further the EMF bias in the annular illumination was 20.0[nm] or less so that the EMF biases were small.

On the other hand, with respect to each of the light-shielding films 2 obtained in Reference Example 1 and Comparative Example 1, the EMF bias in the dipole illumination was greater than 3.0[nm] and further the EMF bias in the annular illumination was greater than 20.0[nm] so that the EMF biases were large. That is, it is seen that when a transfer mask to be subjected to annular illumination is manufactured using the mask blank having the light-shielding film 2 of Reference Example 1 or Comparative Example 1, it is not possible to form a pattern including a line & space (L&S) pattern of DRAM half-pitch (hp) 40 nm.

Then, a binary transfer mask was manufactured using each of the mask blanks 10 of Examples 1 and 2, Reference Example 1, and Comparative Examples 1 and 2 manufactured as described above. FIGS. 2A to 2F show manufacturing processes thereof. As a transfer pattern to be formed in the light-shielding film 2 of each transfer mask, a circuit pattern including a L&S pattern of DRAM half-pitch (hp) 40 nm was used. Taking it into account to carry out verification of EB defect correction, a program defect portion (a portion to be a black defect) was also included in the transfer pattern. Further, taking into account the above-mentioned optical simulation results, it was decided to manufacture the transfer masks to be subjected to annular illumination from the mask blanks 10 of Examples 1 and 2 and Comparative Example 2 and it was decided to manufacture the transfer masks to be subjected to dipole illumination from the mask blanks 10 of Reference Example 1 and Comparative Example 1. Further, the transfer patterns were respectively corrected taking into account the EMF biases of the light-shielding films 2 based on the above-mentioned conditions and were respectively converted into drawing data to be written on resist films using an electron beam writing apparatus.

First, a chemically amplified positive resist for electron beam writing (PRL009: manufactured by FUJIFILM Electronic Materials Co., Ltd.) was coated on each mask blank 10 to form a resist film 4 (see FIG. 2A).

Then, using the electron beam writing apparatus, a desired pattern was written on the resist film 4 (see FIG. 2B) and, thereafter, the resist film 4 was developed with a predetermined developer, thereby forming a resist pattern 4a (see FIG. 2C).

Figure 2D:
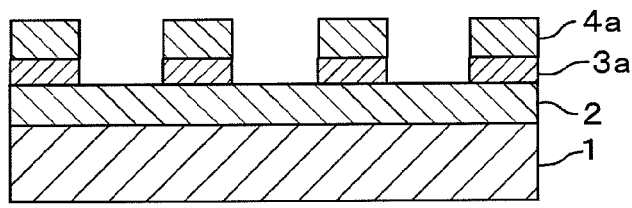
Figure 2E:
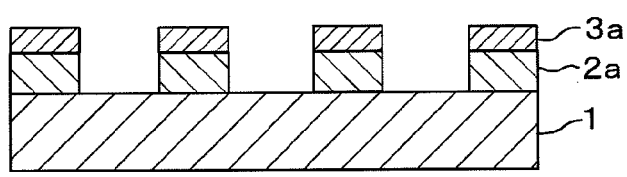

Then, using the resist pattern 4a as a mask, the etching mask film 3 in the form of the CrN film was dry-etched, thereby forming an etching mask film pattern 3a (see FIG. 2D). In this event, a mixed gas of oxygen and chlorine ($O_2$: $Cl_2$=1:4) was used as a dry etching gas.

Then, the remaining resist pattern 4a was removed by ashing or the like. Then, using the etching mask film pattern 3a as a mask, the light-shielding film 2 was dry-etched, thereby forming a light-shielding film pattern 2a (see FIG. 2E). In this event, a mixed gas of $SF_6$ and He was used as a dry etching gas. Finally, the etching mask film pattern 3a was removed using a mixed gas of oxygen and chlorine ($O_2$: $Cl_2$=1:4) (see FIG. 2F).

Figure 2F:
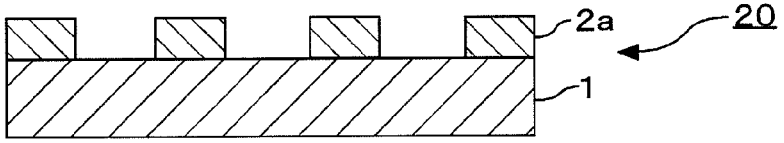

In the manner described above, a binary transfer mask 20 was obtained (see FIG. 2F).

Then, a $XeF_2$ gas as a fluorine-containing substance was supplied to a program defect portion (a black defect portion where the light-shielding film remained) of each binary transfer mask 20 and, further, an electron beam (5.0 keV) was irradiated thereto, thereby carrying out EB defect correction for removing the black defect portion by etching.

As a result of the EB defect correction, the black defect was satisfactorily corrected without the occurrence of a disadvantage, such as an undercut of the lower layer, with respect to the light-shielding films 2 obtained in Examples 1 and 2 and Reference Example 1. Further, in the EB defect correction, there was no occurrence of a defect such as a pinhole on the surface of the upper layer.

On the other hand, with respect to the transfer mask 20 having the light-shielding film 2 obtained in Comparative Example 1 or 2, a side wall of the lower layer of a pattern portion formed with the black defect was largely retreated from an expected position so that there occurred a state where the lower layer is largely retreated laterally as compared with the upper layer (undercut). Further, even a portion, which should not be corrected, was etched so that it was not possible to satisfactorily correct only the black defect portion and thus that there occurred a disadvantage such as an undercut of the lower layer of a pattern portion other than the portion where the black defect was formed.

Further, with respect to the transfer mask 20 having the light-shielding film 2 obtained in Comparative Example 1, even at a portion not irradiated with the electron beam (i.e. a portion other than the black defect portion), etching proceeded from the surface of the upper layer to cause a film loss due to the ambient $XeF_2$ gas so that a plurality of pinholes were formed on the surface of the upper layer.

Then, using each of the obtained binary transfer masks 20, a transfer pattern was exposed and transferred to a resist film on a semiconductor wafer as a transfer object. An exposure apparatus of the immersion type with annular illumination using an ArF excimer laser as a light source was used for the transfer masks of Examples 1 and 2 and Comparative Example 2. On the other hand, an exposure apparatus of the immersion type with dipole illumination using an ArF excimer laser as a light source was used for the transfer masks of Reference Example 1 and Comparative Example 1. Specifically, by setting the binary transfer mask 20 of each of the Examples, Reference Example, and Comparative Examples on a mask stage of the exposure apparatus, a transfer pattern was exposed and transferred to an ArF immersion exposure resist film formed on a semiconductor wafer. Then, the exposed resist film was developed, thereby forming a resist pattern. Then, using the resist pattern, a circuit pattern including a L&S pattern of DRAM half-pitch (hp) 40 nm was formed on the semiconductor wafer.

Each of the obtained circuit patterns on the semiconductor wafers was observed using a transmission electron microscope (TEM). As a result, the circuit pattern formed using the transfer mask 20 having the light-shielding film 2 obtained in Example 1 or 2 or Reference Example 1 fully satisfied the specification of a L&S pattern of DRAM half-pitch (hp) 40 nm.

On the other hand, with respect to the circuit pattern formed using the transfer mask 20 having the light-shielding film 2 obtained in Comparative Example 1 or 2, many short-circuit portions and open-circuit portions were found at a L&S pattern portion and thus the circuit pattern did not satisfy the specification of a L&S pattern of DRAM half-pitch (hp) 40 nm.

From the above, it has been demonstrated that, by adjusting the nitrogen content of the material of the lower layer of the light-shielding film 2 to 21 at % or more and the refractive index n thereof to 1.9 or less, adjusting the refractive index n of the material of the upper layer to 2.1 or less, and adjusting the nitrogen content of the surface layer, in which oxygen is contained, of the upper layer to 14 at % or more, it is possible to solve the problems such as the undercut which otherwise arise when the EB defect correction technique is applied to the black defect portion of the light-shielding film, and further to make small the bias due to the EMF effect.

While this invention has been described with reference to the embodiment, the technical scope of the invention is not limited to the scope of the description of the above-mentioned embodiment. It is obvious to a person skilled in the art that various changes or improvements can be added to the above-mentioned embodiment. It is clear from the description of claims that the modes added with such changes or improvements can also be included in the technical scope of this invention.

What is claimed is:

1. A mask blank adapted to manufacture a transfer mask applied with ArF excimer laser exposure light, comprising:
    a transparent substrate; and
    a light-shielding film formed on the transparent substrate, the light-shielding film serving to form a transfer pattern;
    wherein the light-shielding film has an at least two-layer structure comprising a lower layer and an upper layer from a side of the transparent substrate,
    the lower layer contains a transition metal, silicon, and nitrogen and is made of a material having a refractive index n of 1.9 or less and an extinction coefficient k of 2.2 or more,
    the upper layer contains a transition metal, silicon, and nitrogen and is made of a material having a refractive index n of 2.1 or less an extinction coefficient k of 1.6 or less, and
    a difference between a ratio obtained by dividing a content of the transition metal in the lower layer by a total content of the transition metal and the silicon in the lower layer and a ratio obtained by dividing a content of the transition metal in the upper layer by a total content of the transition metal and the silicon in the upper layer is 4% or less.

2. The mask blank according to claim 1, wherein the refractive index n of the material of the upper layer is greater than the refractive index n of the material of the lower layer.

3. The mask blank according to claim 1, wherein the lower layer is substantially free of oxygen.

4. The mask blank according to claim 1, wherein a surface layer of the upper layer contains oxygen and has a nitrogen content of 14 at % or more.

5. The mask blank according to claim 1, wherein a content of the transition metal in the upper layer is 10 at % or less.

6. The mask blank according to claim 1, wherein an etching rate, with respect to a fluorine-containing substance, of the light-shielding film is 0.3 nm/sec or less in a state where the light-shielding film is not irradiated with charged particles.

7. The mask blank according to claim 1, wherein a ratio obtained by dividing a content of the transition metal in the lower layer by a total content of the transition metal and the silicon in the lower layer and a nitrogen content in the lower layer are in ranges satisfying a condition of a formula (1) given by $$C_N \geq -0.00526 C_{Mo}^2 - 0.640 C_{Mo} + 26.624$$

where $C_{Mo}$ is the ratio obtained by dividing the content of the transition metal in the lower layer by the total content of the transition metal and the silicon in the lower layer and $C_N$ is the nitrogen content in the lower layer.

8. The mask blank according to claim 1, wherein the light-shielding film has a thickness of 52 nm or less.

9. The mask blank according to claim 1, wherein an etching mask film is provided on an upper surface of the light-shielding film and contains chromium and at least one of nitrogen and oxygen, and
    a chromium content in the etching mask film is 50 at % or more.

10. A transfer mask manufactured using the mask blank according to claim 1.

11. A transfer mask adapted to be applied with ArF excimer laser exposure light, comprising:
    a transparent substrate; and
    a light-shielding film formed on the transparent substrate, the light-shielding film having a transfer pattern;
    wherein the light-shielding film has an at least two-layer structure comprising a lower layer and an upper layer from a side of the transparent substrate,
    the lower layer contains a transition metal, silicon, and nitrogen and is made of a material having a refractive index n of 1.9 or less and an extinction coefficient k of 2.2 or more,
    the upper layer contains a transition metal, silicon, and nitrogen and is made of a material having a refractive index n of 2.1 or less an extinction coefficient k of 1.6 or less, and
    a difference between a ratio obtained by dividing a content of the transition metal in the lower layer by a total content of the transition metal and the silicon in the lower layer and a ratio obtained by dividing a content of the transition metal in the upper layer by a total content of the transition metal and the silicon in the upper layer is 4% or less.

12. The transfer mask according to claim 11, wherein the refractive index n of the material of the upper layer is greater than the refractive index n of the material of the lower layer.

13. The transfer mask according to claim 11, wherein the lower layer is substantially free of oxygen.

14. The transfer mask according to claim 11, wherein a content of the transition metal in the upper layer is 10 at % or less.

15. The transfer mask according to claim 11, wherein an etching rate, with respect to a fluorine-containing substance, of the light-shielding film is 0.3 nm/sec or less in a state where the light-shielding film is not irradiated with charged particles.

16. The transfer mask according to claim 11, wherein a ratio obtained by dividing a content of the transition metal in the lower layer by a total content of the transition metal and the silicon in the lower layer and a nitrogen content in the lower layer are in ranges satisfying a condition of a formula (1) given by $$C_N \geq -0.00526 C_{Mo}^2 - 0.640 C_{Mo} + 26.624$$

where $C_{Mo}$ is the ratio obtained by dividing the content of the transition metal in the lower layer by the total content of the transition metal and the silicon in the lower layer and $C_N$ is the nitrogen content in the lower layer.

17. The transfer mask according to claim 11, wherein the transfer pattern of the light-shielding film includes a line and space pattern of half-pitch 40 nm or less.

18. A method of manufacturing the transfer mask using the mask blank according to claim 1, comprising:
    a step of forming the transfer pattern in the light-shielding film of the mask blank; and
    a defect correction step of making a comparison between a design transfer pattern and the transfer pattern formed in the light-shielding film and etching a defect portion, where the light-shielding film remains, by supplying a fluorine-containing substance to the defect portion and irradiating charged particles to the defect portion.

19. A method of manufacturing a semiconductor device, comprising:
   forming a circuit pattern on a semiconductor wafer using the transfer mask according to claim 11.

20. A method of manufacturing a semiconductor device, comprising:
   forming a circuit pattern on a semiconductor wafer using the transfer mask manufactured by the method according to claim 18.

21. The method according to claim 19, wherein the circuit pattern formed on the semiconductor wafer includes a line and space pattern of half-pitch 40 nm or less.

22. The method according to claim 20, wherein the circuit pattern formed on the semiconductor wafer includes a line and space pattern of half-pitch 40 nm or less.

* * * * *